(12) United States Patent
Nagai (10) Patent No.: US 9,332,684 B2
(45) Date of Patent: May 3, 2016

(54) ELECTRONIC COMPONENT MOUNTING SYSTEM

(75) Inventor: Daisuke Nagai, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 317 days.

(21) Appl. No.: 14/131,807

(22) PCT Filed: Aug. 31, 2012

(86) PCT No.: PCT/JP2012/005532
§ 371 (c)(1),
(2), (4) Date: Jan. 9, 2014

(87) PCT Pub. No.: WO2013/046542
PCT Pub. Date: Apr. 4, 2013

(65) Prior Publication Data
US 2014/0157591 A1    Jun. 12, 2014

(30) Foreign Application Priority Data

Sep. 27, 2011    (JP) .................................. 2011-210370

(51) Int. Cl.
*H05K 13/04* (2006.01)
*H05K 13/08* (2006.01)
*H05K 3/34* (2006.01)

(52) U.S. Cl.
CPC ................ *H05K 13/04* (2013.01); *H05K 13/08* (2013.01); *H05K 3/341* (2013.01); *H05K 2203/163* (2013.01); *Y10T 29/53174* (2015.01)

(58) Field of Classification Search
CPC ....... H05K 3/341; H05K 13/04; H05K 13/08; H05K 2203/163; Y10T 29/53174
See application file for complete search history.

(56) References Cited

U.S. PATENT DOCUMENTS

| 6,026,566 | A | 2/2000 | Urban et al. |
| 2008/0257937 | A1 | 10/2008 | Kihara et al. |
| 2009/0064489 | A1 | 3/2009 | Inoue et al. |

FOREIGN PATENT DOCUMENTS

| CN | 1259268 A | 7/2000 |
| CN | 101385409 A | 3/2009 |
| CN | 100518486 C | 7/2009 |
| EP | 1 330 151 A1 * | 7/2003 |
| JP | H05-007100 A | 1/1993 |

(Continued)

OTHER PUBLICATIONS

International Search Report for Application No. PCT/JP2012/005532 dated Oct. 9, 2012.

*Primary Examiner* — Carl Arbes
(74) *Attorney, Agent, or Firm* — Pearne & Gordon LLP (57) ABSTRACT

A substrate standby unit that is capable of keeping only one substrate 4 on standby in a substrate sorting mechanism 40 that moves the substrate 4 from the print inspection device M2 to the component installation device M4, a memory device 60 that stores a substrate ID on the substrate 4 that is on standby in the substrate standby unit, and a substrate ID management unit 46 that updates the substrate ID that is stored in the memory device 60 accompanying the transfer of the substrate 4 from the print inspection device M2 to the substrate standby unit are included. The substrate ID stored in the memory device 60 and the inspection result data associated with this substrate ID and stored in an inspection result data memory unit 45 are transmitted to the component installation device M4.

4 Claims, 4 Drawing Sheets

(56) References Cited

FOREIGN PATENT DOCUMENTS

| JP | 3-462197 | * | 11/2003 |
| JP | 2006-202804 A | | 8/2006 |
| JP | 2006-216589 A | | 8/2006 |
| JP | 2006-319378 A | | 11/2006 |
| JP | 2006-324424 A | | 11/2006 |
| JP | 3900166 A | * | 1/2007 |
| JP | 2008-171330 A | | 7/2008 |
| JP | 2008-198730 A | | 8/2008 |
| JP | 2009-123891 A | | 6/2009 |

* cited by examiner

ELECTRONIC COMPONENT MOUNTING SYSTEM

TECHNICAL FIELD

The present invention relates to an electronic component mounting system for mounting electronic components on a substrate to produce a mount substrate.

BACKGROUND ART

An electronic component mounting system for mounting electronic components on a substrate to produce a mount substrate includes a plurality of connected devices for electronic components mounting such as a solder printing device, an electronic components installation device, and a reflow device. In recent years, upon requests to improve mounting operation accuracy and requests to improve productivity, systems for feedforwarding inspection results in individual steps of the electronic components mounting devices to a downstream process have been used (e.g., see Patent Document 1). In the related art shown in this patent document example, in components mounting in which electronic components are mounted on a multiple substrate that includes a plurality of unit substrates, whether a printed state of solder is good or bad is judged by a solder printed state inspection, and a result of the judgment is fed forward as solder inspection data to an electronic components installation device in a downstream process. Thus, the effect of capable of eliminating a waste of mounting the electronic components on the unit substrates that have printing failures is achieved.

RELATED ART DOCUMENTS

Patent Document

Patent Document 1: JP-A-2006-202804

SUMMARY OF THE INVENTION

Problems to be Solved by the Invention

In the above-described feedforward system, an operation in the downstream process is carried out based on the inspection result data, so that correspondence relations between actual substrates and the inspection result data need to be secured during the process of substrate conveyance/data transfer. However, in related arts including the above-described patent document example, when there is space where a substrate is kept on standby such as a substrate conveying conveyer between devices constituting an electronic component mounting system, correspondence relations between substrates that are actually loaded in a downstream process and transferred inspection result data result in disturbance when a substrate that is kept on standby is taken out for some reason.

In order to prevent the above-described inconvenience, securing the correspondence relations between the substrates and the inspection result data is considered by providing an ID mark for identification to each of the substrates to link the identification information to the inspection result data of each of the substrates, and reading out the ID marks with the use of an ID readout device every time the operation is carried out to identify the substrates. However, the ID marks for identification are usually provided only on the front sides, so that the ID marks cannot be read out when carrying out an operation that is intended for the back sides. For this reason, in order to perform identification of the substrates on both the front and back sides in a convincing way, it is necessary to additionally provide an ID readout device on a lower surface side of the substrates so that the ID marks can be read out during the operation that is intended for the back sides, which causes complication of the device and an increase in equipment cost. As described above, in the related-art electronic component mounting systems, there is a problem in that it is difficult to secure the correspondence relations between the substrates and the inspection result data in a simple method in the system for feedforwarding the inspection results to the downstream process.

Thus, an object of the present invention is to provide an electronic component mounting system that is capable of securing correspondence relations between substrates and inspection result data in a simple method in a system for feedforwarding inspection results to a downstream process.

Means for Solving the Problems

An electronic component mounting system according to the present invention includes a plurality of connected devices for electronic components mounting, and mounts an electronic component on a substrate by solder connection to produce a mount substrate, the electronic component mounting system including: a printing device that prints solder on an electrode that is formed on the substrate; a print inspection device that inspects a printed state of the solder that is printed on the substrate; a memory unit that stores an inspection result of the printed state as individual inspection result data that is associated with substrate identification information with which each substrate is identified; a component installation device comprising a component installation mechanism that picks up the electronic component from a component supply unit to install the electronic component on the substrate on which the solder is printed based on the inspection result data; a substrate standby unit that is provided on a transfer pathway where the substrate is transferred from the print inspection device to the component installation device, and is capable of keeping only one substrate on standby; a substrate conveying unit that receives an unloadable signal for indicating that substrate unloading from the print inspection device is possible and a loadable signal for indicating that substrate loading into the component installation device is possible to carry out conveyance of the substrate after printed from the print inspection device to the component installation device; a standby substrate information memory unit that stores the substrate identification information on the substrate that is on standby in the substrate standby unit; an identification information update processing unit that updates the substrate identification information that is stored in the standby substrate information memory unit accompanying the transfer of the substrate from the print inspection device to the substrate standby unit; and information transmission means for transmitting the substrate identification information stored in the standby substrate information memory unit and the inspection result data associated with this substrate identification information to the component installation device.

Advantageous Effects of the Invention

According to the present invention, with the configuration that the substrate standby unit that is capable of keeping only one substrate on standby on the transfer pathway where the substrate is transferred from the print inspection device to the component installation device, the standby substrate information memory unit that stores the substrate identification information on the substrate that is on standby in the substrate standby unit, and the identification information update processing unit that updates the substrate identification information that is stored in the standby substrate information memory unit accompanying the transfer of the substrate from the print inspection device to the substrate standby unit are included, and that the substrate identification information stored in the standby substrate information memory unit and the inspection result data associated with this substrate identification information are transmitted to the component installation device, a correspondence relation between the substrate and the inspection result data can be secured in a simple method in a system for feedforwarding the inspection result data to a downstream process.

MODE FOR CARRYING OUT THE INVENTION

Figure 1:
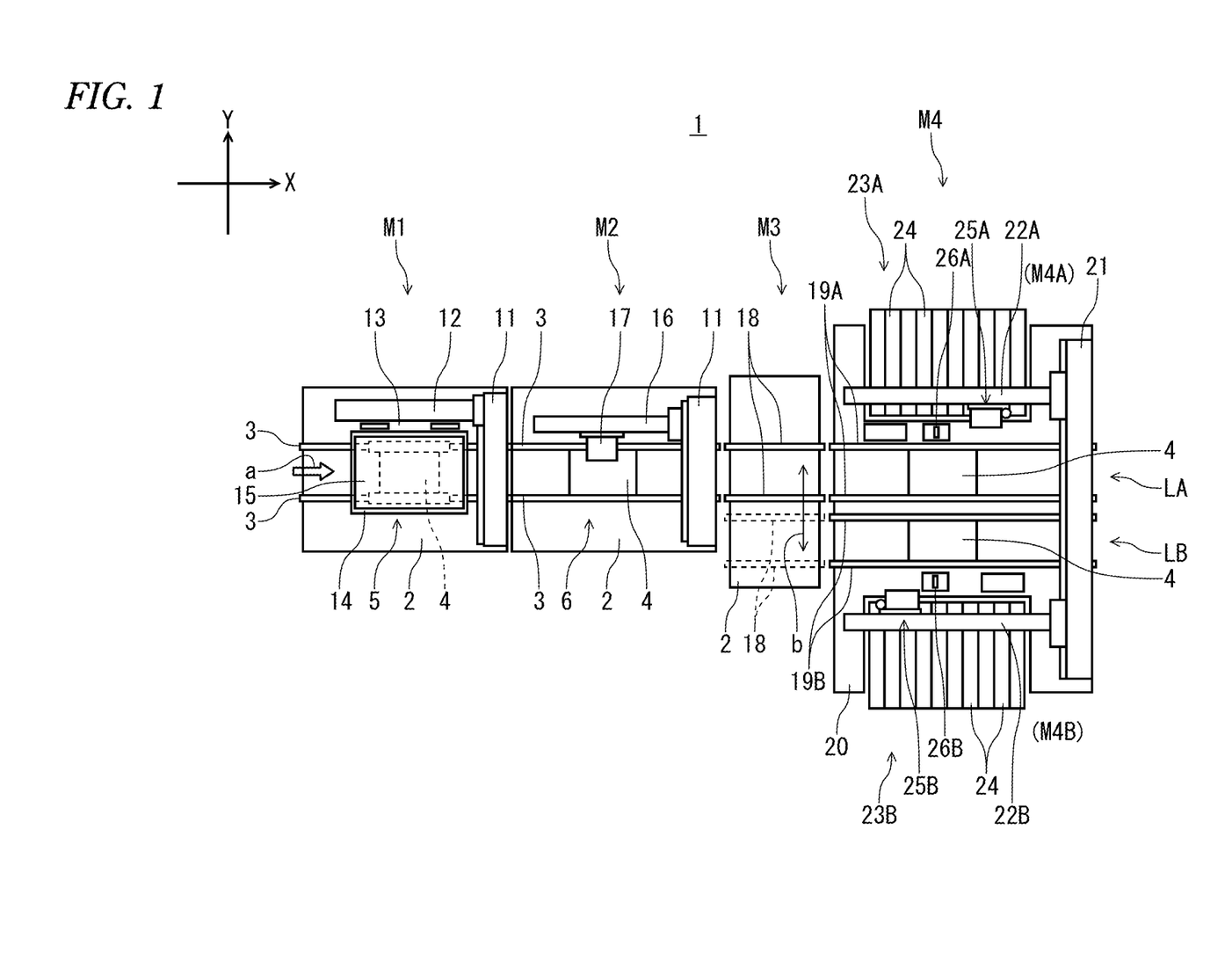
FIG. 1 is a plan view of an electronic component mounting system according to an embodiment of the present invention.

First, a description of an electronic component mounting system 1 will be provided with reference to FIG. 1. The electronic component mounting system 1 has the function of mounting electronic components on a substrate by solder connection to produce a mount substrate, and includes a plurality of devices for electronic components mounting that are connected in series. Here, the electronic component mounting system 1 has a configuration that a printing device M1, a print inspection device M2, a substrate sorting device M3, and a component installation device M4 that are connected in series, the component installation device M4 being located downstream of the printing device M1, the print inspection device M2, and the substrate sorting device M3, and including a plurality of (two in the present embodiment) substrate conveying mechanisms. Hereinafter, a description of each of the devices will be provided. The printing device M1 has the function of printing a solder paste for electronic components connection on a substrate that is subject to mounting, and a substrate conveying mechanism 3 that conveys a substrate 4 that is subject to mounting in a substrate conveying direction and a substrate positioning unit 5 that performs positioning of the conveyed substrate 4 to hold the substrate 4 are disposed on an upper surface of a base 2. A mask plate 15 that is laid on a mask frame 14 is disposed above the substrate positioning unit 5, and further above the mask plate 15, a screen printing unit 36 (see FIG. 2) that horizontally drives a squeegee unit 13 that is held by a transfer beam 12 with the use of a Y-axis table 11 is disposed.

The substrate 4 that is supplied from the upstream side (the arrow a) and of which positioning is performed by the substrate positioning unit 5 is brought into contact with a lower surface of the mask plate 15, and the Y-axis table 11 is driven and the squeegee unit 13 is slid on an upper surface of the mask plate 15 on which the solder paste is supplied, and thereby the solder paste is printed on electrodes for components connection that are formed on the substrate 4 via a pattern hole provided on the mask plate 15. That is, the printing device M1 that serves as an operation device on the upstream side performs a printing operation of the solder paste that is a predetermined operation with respect to the substrate 4.

The print inspection device M2 has the function of receiving the substrate 4 on which the printing operation has been carried out by the printing device M1, and performing a print inspection of inspecting a printed state of the solder paste that is printed on the substrate 4. The substrate conveying mechanism 3 that is connected with the printing device M1, and a substrate positioning unit 6 are disposed on the upper surface of the base 2 of the print inspection device M2. Further above the substrate positioning unit 6, a camera 17 for inspection that horizontally moves with the use of a camera moving mechanism that includes a Y-axis table 11 and a transfer beam 16 is disposed. Driving the camera moving mechanism allows the camera 17 to horizontally move above the substrate 4 and capture an image of the substrate 4 at a given position. Then, print inspection is carried out by subjecting a result of the captured image to recognition processing with the use of an image recognition unit 43 (see FIG. 2), and subjecting a result of the recognition processing to determination processing with the use of an inspection processing unit 44.

In this print inspection, inspection result data that contains a good or bad judgment result of the printed state, and a detection result of a positional deviation amount that indicates a positional deviation state from a regular position of the printed position of the solder paste on the pertinent substrate is created for every substrate 4, and stored. Then, the inspection result data is transmitted to the component installation device M4 located downstream. In the component installation device M4, correction of a component installation position at which the electronic components are actually mounted is performed on the substrate 4 based on the solder positional deviation amount data.

A sorting conveyer 18 including a conveyer mechanism that is provided on the upper surface of the base 2 and conveys the substrate 4 in the substrate conveying direction is provided to the substrate sorting device M3 located downstream of the print inspection device M2, and the sorting conveyer 18 is shiftable in a Y direction (the arrow b) that is perpendicular to the substrate conveying direction with the use of a conveyer moving mechanism (not shown in the drawing). The sorting conveyer 18 and the conveyer moving mechanism constitute a substrate sorting mechanism 40 (see FIG. 2) that sorts the substrate 4 received from the upstream side into two substrate conveying mechanisms 19A, 19B that are provided to the component installation device M4 to be described below.

In the sorting conveyer 18 that is a transfer pathway where the substrate 4 is transferred from the print inspection device M2 to the component installation device M4 in the substrate sorting device M3 is provided with a substrate standby unit that is capable of keeping only one substrate 4 on standby. When substrate loading preparation is not completed in the component installation device M4, the substrate 4 that is loaded from the print inspection device M2 into the substrate sorting device M3 stops at the sorting conveyer 18, and is temporarily kept on standby until substrate loading preparation of the component installation device M4 is completed.

In the present embodiment, because the component installation device M4 includes the plurality of substrate conveying mechanisms 19A, 19B, the substrate sorting mechanism 40 that sorts the substrate 4 into the substrate conveying mechanisms 19A, 19B is provided, and the substrate standby unit is provided using a substrate conveying space in the substrate sorting mechanism 40. It is also preferable to have a configuration such that when a plurality of substrate conveying mechanisms are provided in the print inspection device M2 on the upstream side, the substrate is sorted into these substrate conveying mechanisms. Further, while the sorting conveyer 18 in the substrate sorting mechanism 40 serves as the substrate standby unit in the present embodiment, if a space that is capable of keeping only one substrate 4 on standby is secured on the transfer pathway where the substrate 4 is transferred from the print inspection device M2 to the component installation device M4, it is also preferable to provide the substrate standby unit to the print inspection device M2 or the component installation device M4.

The component installation device M4 located downstream of the substrate sorting device M3 has a configuration that the two lines of substrate conveying mechanisms 19A, 19B each of which is disposed in an X direction respectively include component mounting units M4A, M4B that serve as component installation devices that are individually movable, and the substrate conveying mechanism 19A and the component mounting unit M4A constitute one component mounting lane LA, and the substrate conveying mechanism 19B and the component mounting unit M4B also constitute one component mounting lane LB.

Next, a description of the component installation device M4 will be provided. The pair of substrate conveying mechanisms 19A, 19B are disposed parallel to each other in the substrate conveying direction (X direction) in the center of a base 20. The substrate conveying mechanisms 19A, 19B convey the substrate 4 that is passed from the print inspection device M2 via the substrate sorting device M3, and perform positioning of the substrate 4 on a mounting stage for performing a component installation operation with the use of a component installation mechanism 55 (see FIG. 2) to be described below.

Component supply units 23A, 23B are respectively provided on the outer sides of the substrate conveying mechanisms 19A, 19B, and a plurality of tape feeders 24 that are parallel to one another are provided to the component supply units 23A, 23B. The tape feeders 24 supply electronic components to component pickup positions by pitch feeding carrier tapes that hold the electronic components to be mounted on the substrate 4. A Y-axis moving table 21 is provided at an end portion on the X direction side of the base 20, and mounting heads 25A, 25B are respectively attached to two X-axis moving tables 22A, 22B that are connected to the Y-axis moving table 21. The mounting heads 25A, 25B include a plurality of unit mounting heads, and hold the electronic components using vacuum aspiration with the use of adsorption nozzles that are each attached to the unit mounting heads.

By driving the Y-axis moving table 21 and the X-axis moving tables 22A, 22B, the mounting heads 25A, 25B horizontally move in the X direction and the Y direction. Thus, the mounting heads 25A, 25B absorb to take out the electronic components from the tape feeders 24 of the component supply units 23A, 23B, respectively, and transfer to mount the electronic components on the substrate 4 of which positioning has been performed on the mounting stage of the substrate conveying mechanisms 19A, 19B. The Y-axis moving table 21, the X-axis moving tables 22A, 22B, and the mounting heads 25A, 25B constitute the component installation mechanism 55 that picks up the electronic components from the component supply units 23A, 23B to mount the electronic components on the substrate 4 on which the solder has been printed based on the inspection result data transmitted from the print inspection device M2.

Component recognition cameras 26A, 26B are provided on transfer pathways of the mounting heads 25A, 25B, and the mounting heads 25A, 25B holding the electronic components move above the component recognition cameras 26A, 26B, and thereby the component recognition cameras 26A, 26B capture images of the electronic components held by the mounting heads 25A, 25B from beneath to recognize the electronic components. That is, the electronic component mounting system 1 having the above-described configuration is configured to sort the substrate on which a predetermined operation with the use of the printing device M1 that is the operation device on the upstream side, that is, a printing operation has been performed into the component mounting units M4A, M4B that serve as the component installation device including the plurality of bases to perform a component mounting operation.

Figure 2:
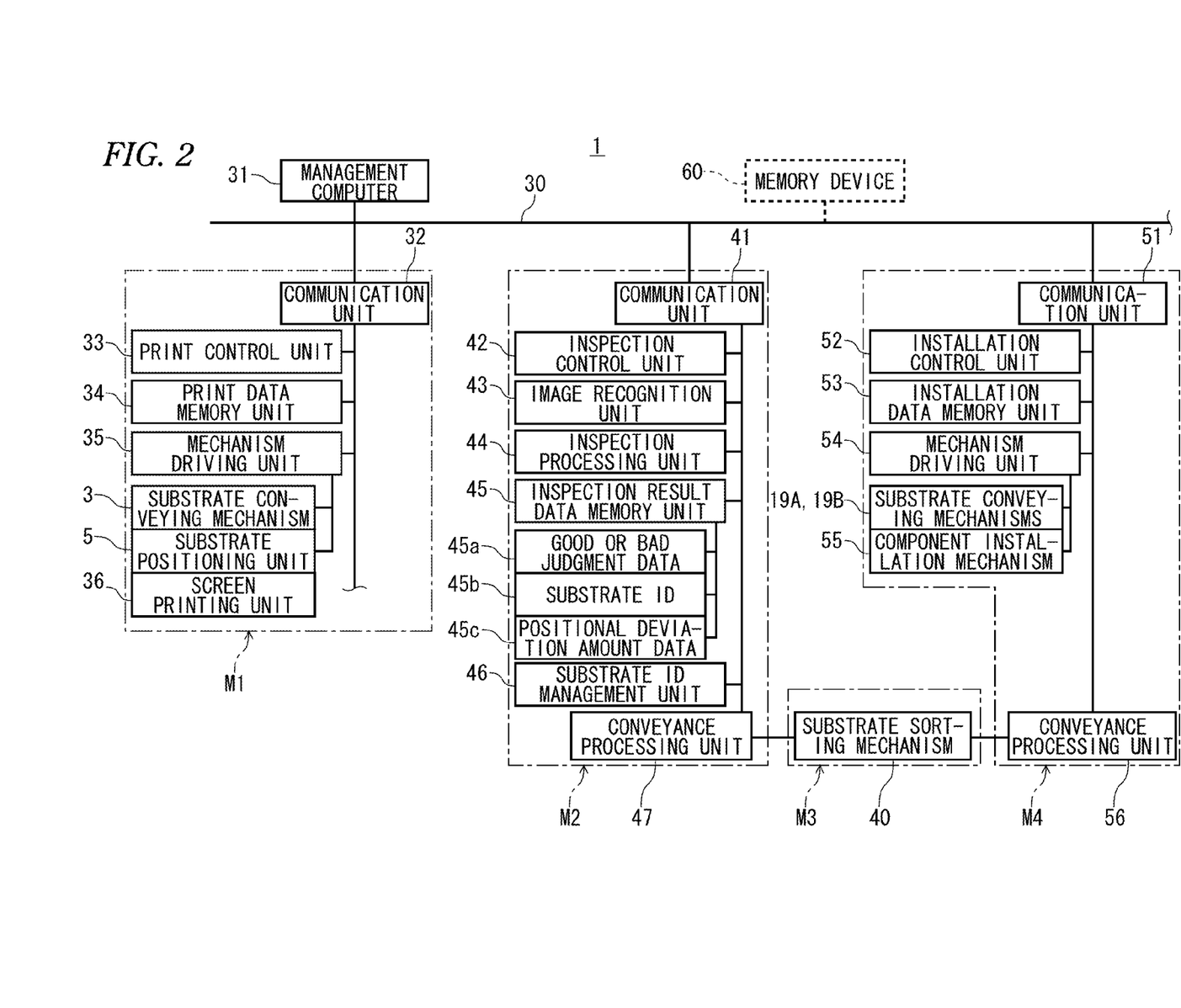
FIG. 2 is a block diagram of the electronic component mounting system according to the embodiment of the present invention showing a configuration of a control system.

Next, referring to FIG. 2, a description of the configuration of a control system of the electronic component mounting system 1 will be provided. In FIG. 2, the printing device M1, the print inspection device M2, and the component installation device M4 are connected to each other via a LAN line 30, and further, the LAN line 30 is connected to a management computer 31. That is, the LAN line 30 has a configuration of mutually connecting the print inspection device M2 and the component installation device M4, and the management computer 31 has the function of controlling the entire movement of the electronic component mounting system 1.

The printing device M1 includes a communication unit 32, a print control unit 33, a print data memory unit 34, and a mechanism driving unit 35. The communication unit 32 gives and receives signals between the management computer 31 and other devices via the LAN line 30. The print control unit 33 controls a printing operation by the printing device M1 based on a control signal that the print control unit 33 receives via the communication unit 32. The print data memory unit 34 stores print data for each kind of substrate, the print data being required for carrying out the printing operation. The mechanism driving unit 35 is controlled by the print control unit 33, and controls the substrate conveying mechanism 3, the substrate positioning unit 5, and the screen printing unit 36. The print inspection device M2 includes a communication unit 41, an inspection control unit 42, the image recognition unit 43, the inspection processing unit 44, an inspection result data memory unit 45, a substrate ID management unit 46, and a conveyance processing unit 47. The communication unit 41 gives and receives signals between the management computer 31 and other devices via the LAN line 30. The inspection control unit 42 controls a print inspection operation carried out by the print inspection device M2.

The image recognition unit 43 subjects the images of the substrates 4 after printed that are captured by the camera 17 to recognition processing. The inspection processing unit 44 performs processing for carrying out print inspection for each of the substrates 4 based on results of the recognition processing performed by the image recognition unit 43. In this print inspection, the inspection result data that contains the good or bad judgment result of the printed state, and the detection result of the positional deviation amount that indicates the positional deviation state from the regular position of the printed position of the solder paste on the pertinent substrate is created for each of the substrates 4. The inspection result data memory unit 45 stores the inspection result data thus created. The inspection result data contains good or bad judgment data 45a that indicates the good or bad judgment results of the printed states of the substrates 4, positional deviation amount data 45c that indicates the detection results of the positional deviation amounts, and substrate IDs 45b that serve as substrate identification information for identifying to distinguish the individual substrates 4 from the other substrates. That is, the inspection result data memory unit 45 functions as a memory unit that stores the inspection results of the printed states as individual inspection result data that is associated with the substrate identification information with which the individual substrates 4 are identified. Also, the inspection result data may be transmitted to the management computer 31 via the LAN line 30 and stored in a memory device of the management computer 31.

The substrate ID management unit 46 performs processing relating to control of the substrate identification information that is required for securing a correspondence relation between the substrate 4 that is subject to the print inspection in the print inspection device M2 and the obtained inspection result data on this pertinent substrate 4. All of the substrates 4 that are subject to operations performed in an electronic components mounting line are not provided with substrate IDs for identifying the substrates 4. However, because it is required to exactly control the correspondence relation between the inspection result data and the individual substrate in the operation control after the print inspection, a substrate ID controlling function is provided to the print inspection device M2, and the processing required for securing the correspondence relation between the substrate ID and the inspection result data is carried out.

First, when the substrate 4 that is provided in advance with a substrate ID such as bar codes are subject to the print inspection, the substrate ID management unit 46 reads the substrate ID with the use of a bar-code reader or the like, and writes the substrate ID as a substrate ID 45b in the inspection result data memory unit 45. In addition, when the substrate 4 provided with no substrate ID is subject to the print inspection, the substrate ID management unit 46 generates a specific substrates ID for the substrate that is newly loaded, and writes the substrate ID as a substrate ID 45b in the inspection result data memory unit 45. Then, when the substrate 4 after the print inspection is unloaded from the print inspection device M2, the substrate ID management unit 46 outputs the substrate ID that corresponds to the substrate 4 that is subject to the unloading.

Then, the output substrate ID is written in a memory device 60 connected with the LAN line 30. The memory device 60 functions as a standby substrate information memory unit that stores the substrate ID (substrate identification information) on the substrate 4 that is kept on standby in the substrate standby unit that is set in the sorting conveyer 18 of the substrate sorting device M3. At this point, accompanying transfer of a new substrate 4 from the print inspection device M2 to the substrate standby unit of the sorting conveyer 18, the substrate ID stored in the memory device 60 is overwritten with a substrate ID corresponding to the new substrate 4 by the substrate ID management unit 46, and updated. Thus, the substrate ID management unit 46 functions as an identification information update processing unit that updates the substrate identification information stored in the standby substrate information memory unit accompanying the transfer of the substrate 4 from the print inspection device M2 to the substrate standby unit.

It is to be noted that a member to which the memory device 60 belongs in the configuration of the electronic component mounting system 1 is not limited specifically, and it is preferable to use a memory function of either one of the print inspection device M2 and the component installation device M4 as the memory unit 60, and it is also preferable to use a memory function of the management computer 31 as the memory unit 60, or to use an independent memory unit connected with the LAN line 30 as the memory unit 60.

At the time of conveyance of the substrate 4 with respect to the print inspection device M2, the conveyance processing unit 47 expresses whether or not the print inspection device M2 is in a substrate conveyable state in the form of flag signals. That is, the conveyance processing unit 47 expresses whether or not the substrate 4 can be loaded into the print inspection device M2 from the upstream side by either 0 or 1 of a substrate loading preparation completion flag, and also expresses whether or not the substrate 4 can be unloaded into the downstream side from the print inspection device M2 by either 0 or 1 of the substrate unloading preparation completion flag. The conveyance processing unit 47 is connected with the substrate sorting mechanism 40 of the substrate sorting device M3 by a signal line, and the transfer of the substrate 4 from the substrate conveying mechanism 3 of the print inspection device M2 to the sorting conveyer 18 of the substrate sorting device M3 is carried out in a state where the substrate unloading preparation completion flag=(an unloadable signal) is expressed from the conveyance processing unit 47.

The component installation device M4 includes communication units 51, installation control units 52, installation data memory units 53, mechanism driving units 54, and conveyance processing units 56. The communication units 51 give and receive signals between other devices and the management computer 31 via the LAN line 30. The installation control units 52 control a component installation operation by the component installation device M4. The installation data memory units 53 store data required for the components installation operation for each kind of substrate. The mechanism driving units 54 are controlled by the installation control units 52 to drive the substrate conveying mechanisms 19A, 19B, and the component installation mechanism 55.

At the time of the control of the component installation mechanism 55 by the installation control unit 52, the installation control unit 52 accesses the memory device 60 via the communication unit 51 and the LAN line 30, and obtains the substrate ID written in the memory device 60, in other words, the substrate ID with which the substrate 4 that is kept on standby at this time in the substrate standby unit set in the sorting conveyer 18 of the substrate sorting device M3 is identified. Next, the installation control unit 52 obtains the inspection result data that is associated with the identified substrate ID from the inspection result data memory unit 45 of the print inspection device M2. Then, at the time of carrying out the component installation operation, by controlling the component installation mechanism 55 based on the positional deviation amount data 45c of the obtained inspection result data, the installation control unit 52 corrects the component installation position of the electronic components.

In the above-described configuration, the LAN line 30, the communication unit 41 included in the print inspection device M2, and the communication unit 51 included in the component installation device M4 are information transmission means for transmitting the substrate ID that is the substrate identification information stored in the memory device 60 that is the standby substrate information memory unit, and the inspection result data associated with the substrate ID and stored in the inspection result data memory unit 45 of the print inspection device M2 to the component installation device M4.

In a similar manner to the conveyance processing unit 47 in the print inspection device M2, at the time of conveyance of the substrate 4 with respect to the component installation device M4, the conveyance processing unit 56 expresses whether or not the substrate conveying mechanism 19A or the substrate conveying mechanism 19B of the component installation device M4 is in a substrate conveyable state in the form of flag signal. That is, the conveyance processing unit 56 expresses whether or not the substrate 4 can be loaded into the substrate conveying mechanism 19A or the substrate conveying mechanism 19B from the upstream side by either 0 or 1 of a substrate loading preparation completion flag. The conveyance processing unit 56 is connected with the substrate sorting mechanism 40 of the substrate sorting device M3 by a signal line, and the transfer of the substrate 4 from the sorting conveyer 18 of the substrate sorting device M3 to the substrate conveying mechanism 19A or the substrate conveying mechanism 19B of the component installation device M4 is carried out in a state where the substrate loading preparation completion flag=1 (a loadable signal) is expressed from the conveyance processing unit 56 of the substrate conveying mechanism 19A or the substrate conveying mechanism 19B.

In the above-described configuration, the substrate sorting mechanism 40 of the substrate sorting device M3 serves as a substrate conveying unit that receives the unloadable signal for indicating that substrate unloading from the print inspection device M2 is possible and the loadable signal for indicating that substrate loading into the component installation device M4 is possible, and carries out conveyance of the substrate 4 after printed from the print inspection device M2 to the component installation device M4.

Figure 3:
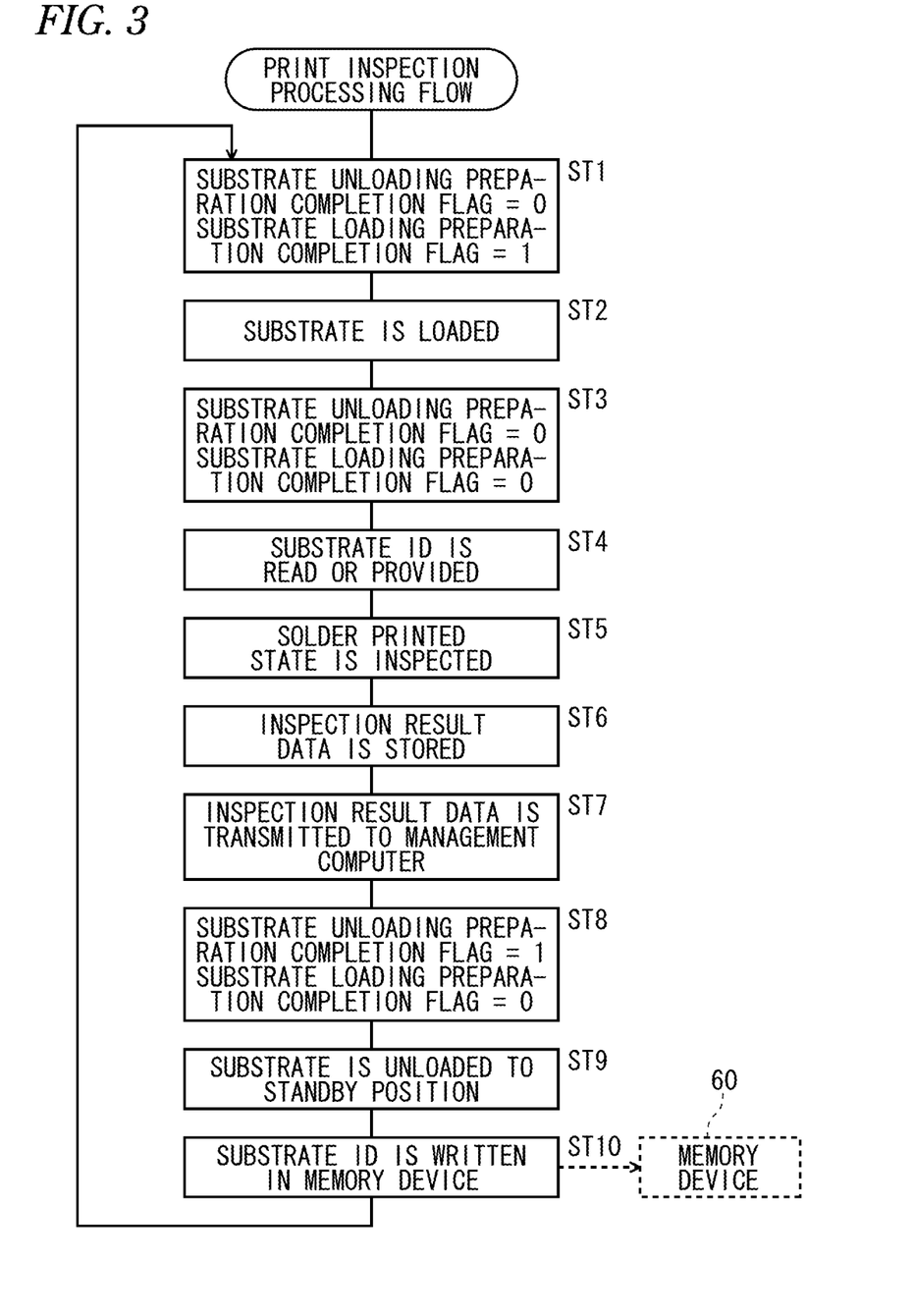
FIG. 3 is a flow chart showing print inspection processing in the electronic component mounting system according to the embodiment of the present invention.

Next, a description of print inspection processing carried out by the print inspection device M2 in the electronic component mounting system 1 will be provided with reference to FIG. 3. First, in the conveyance processing unit 47, the substrate unloading preparation completion flag=0, and the substrate loading preparation completion flag=tare expressed (ST1), and the device on the upstream side is informed that the print inspection device M2 is in the substrate loadable state, and the substrate 4 is loaded (ST2). Then, in response to this state, the substrate unloading preparation completion flag=0, and the substrate loading preparation completion flag=0 are expressed in order to prohibit new loading/unloading of the substrate 4 (ST3).

Next, the substrate ID is read, or a substrate ID is provided, which are for identifying the loaded substrate 4 (ST4). That is, when the loaded substrate 4 has been already provided with the substrate ID such as a bar code, the substrate ID is read by the function of the substrate ID management unit 46 with the use of the attached reader. In addition, when the substrate 4 is provided with no substrate ID, a new substrate ID specific to the pertinent substrate 4 is generated by the substrate ID management unit 46. Then, the substrate ID that is thus read or generated is stored as the substrate ID 45b in the inspection result data memory unit 45.

Next, a solder printed state inspection is carried out (ST5). That is, the image of the loaded substrate 4 captured by the camera 17 is subjected to recognition processing with the use of the image recognition unit 43, and a result of the recognition processing is subjected to inspection processing with the use of the inspection processing unit 44, whereby the good or bad judgment data 45a that indicates whether the printed state is good or bad, and the positional deviation amount data 45c that indicates the positional deviation amount of the printed position are obtained. Then, these inspection result data is associated with the substrate ID 45b to be stored in the inspection result data memory unit 45 (ST6), and, these inspection result data is transmitted to the management computer 31 via the LAN line 30 (ST7).

When the print inspection operation is thus completed, substrate unloading is started. That is, the substrate unloading preparation completion flag=1, and the substrate loading preparation completion flag=0 are expressed (ST8), and the substrate sorting mechanism 40 of the substrate sorting device M3 is informed of the substrate unloadable state, and at this point if the substrate sorting mechanism 40 is capable of loading the substrate, the substrate 4 on which the print inspection has been performed is unloaded to the standby position (substrate standby unit) provided to the sorting conveyer 18 (ST9). Then, accompanying the transfer of the substrate 4 on which the print inspection has been performed to the substrate standby unit, the substrate ID of this pertinent substrate 4 is written in the memory device 60 (ST10). Thus, the substrate ID of the previous substrate 4 that is stored in the memory device 60 is overwritten with the substrate ID of the substrate 4 that is positioned in the substrate standby unit at this time, and updated. Then, after this, these steps are repeated by returning to ST1.

Figure 4:
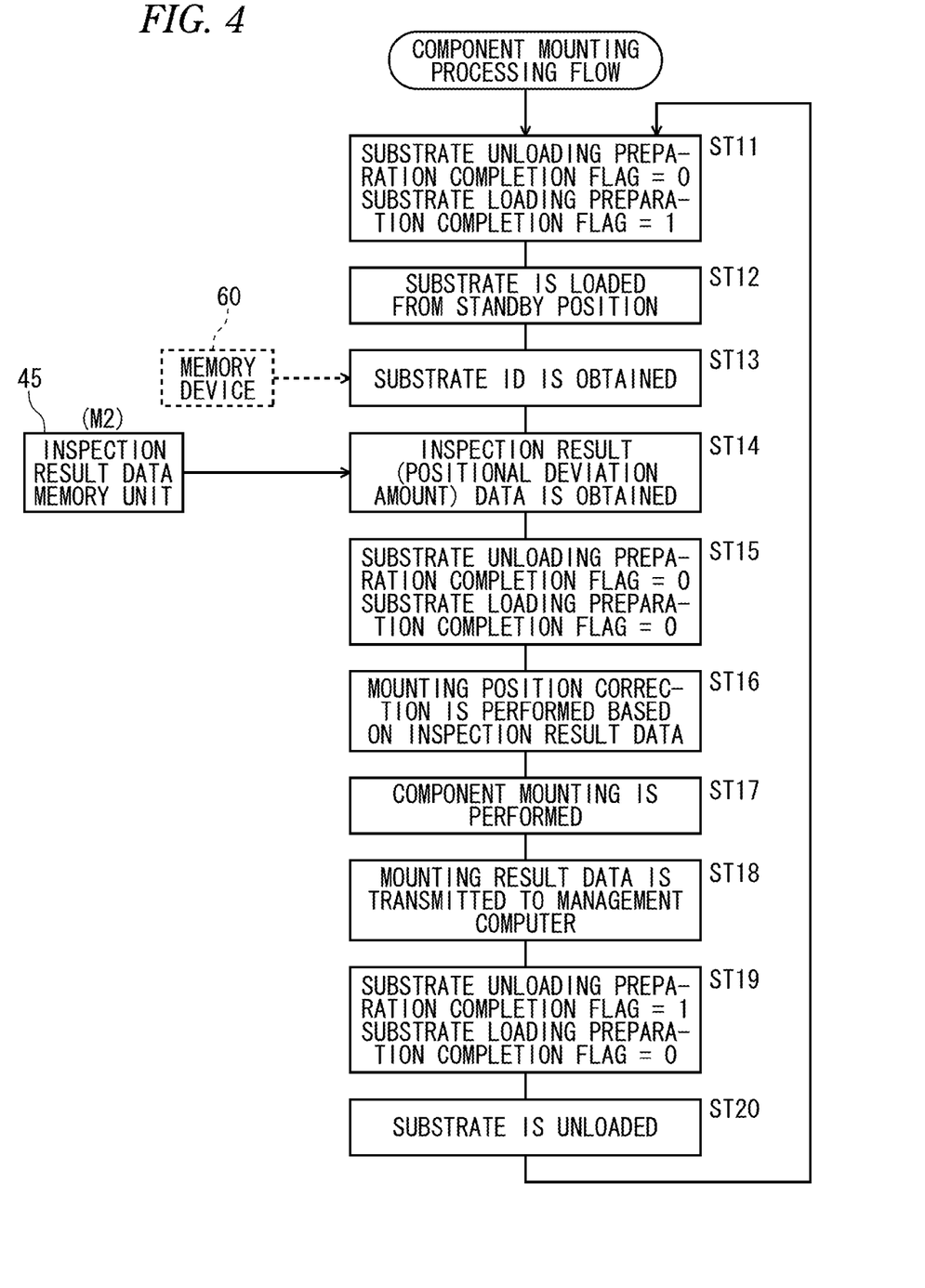
FIG. 4 is a flow chart showing component mounting processing in the electronic component mounting system according to the embodiment of the present invention.

Next, a description of component mounting processing carried out by the component installation device M4 in the electronic component mounting system 1 will be provided with reference to FIG. 4. First, in the conveyance processing unit 56, the substrate unloading preparation completion flag=0, and the substrate loading preparation completion flag=1 are expressed (ST11), and the substrate sorting device M3 is informed that the component installation device M4 is in the substrate loadable state, and the substrate 4 is loaded from the standby position (substrate standby unit) of the sorting conveyer 18 (ST12). Then, the installation control unit 52 accesses the memory device 60, and obtains the stored substrate ID, that is, the substrate ID of the substrate 4 that is newly loaded at this time (ST13). Further, the installation control unit 52 accesses the inspection result data memory unit 45 of the print inspection device M2, and obtains the inspection result data containing the positional deviation amount data 45c that is associated with the obtained substrate ID (ST14). Then, in response to this state, the substrate unloading preparation completion flag=0, and the substrate loading preparation completion flag=0 are expressed in order to prohibit new loading/unloading of the substrate 4 (ST15).

Next, based on the obtained inspection result data, mounting position correction is performed (ST16). That is, based on the positional deviation amount data 45c, the coordinates of the mounting position with which the electronic components are actually installed and landed are corrected. Then, based on the corrected coordinates of the mounting position, component mounting is carried out by the component installation mechanism 55 (ST17). After the component mounting is completed, mounting result data is transmitted to the management computer 31 via the LAN line 30 (ST18).

Upon completion of the component mounting operation in this manner, substrate unloading is started. That is, the substrate unloading preparation completion flag=1, and the substrate loading preparation completion flag=0 are first expressed (ST19), and the device on the downstream side is informed of the substrate unloadable state. If the device on the downstream side is capable of loading the substrate, the substrate 4 on which the components have been mounted is unloaded (ST20). Then, after this, these steps are repeated by returning to ST11.

As described above, the electronic component mounting system 1 according to the present embodiment includes the substrate standby unit that is capable of keeping only one substrate 4 on standby on the transfer pathway where the substrate 4 is transferred from the print inspection device M2 to the component installation device M4, the memory device 60 (standby substrate information memory unit) that stores the substrate ID (substrate identification information) on the substrate 4 that is on standby in the substrate standby unit, and the substrate ID management unit 46 (identification information update processing unit) that updates the substrate ID that is stored in the memory device 60 accompanying the transfer of the substrate 4 from the print inspection device M2 to the substrate standby unit, and has the configuration that the substrate ID stored in the memory device 60 and the inspection result data associated with this substrate ID are transmitted to the component installation device M4.

Thus, in the case where there is space where a substrate is kept on standby such as a substrate conveying conveyer between the devices in the system for feedforwarding the inspection result data to the downstream process, correspondence relations between the substrates and the inspection result data can be secured in the simple method even when a substrate that is kept on standby is taken out for some reason, or the substrates are provided with no ID mark for identification.

The description of the present invention has been presented in detail with reference to the specific embodiment; however, it is be apparent to those skilled in the art that various changes and modifications can be made without departing from the spirit and scope of the present invention.

The present application is based on the Japanese Patent Application filed on Sep. 27, 2011 (No. 2011-210370), and the contents thereof are incorporated herein by reference.

INDUSTRIAL APPLICABILITY

The electronic component mounting system according to the present invention has the effect of capable of securing correspondence relations between substrates and inspection result data in a simple method in a system for feedforwarding an inspection result to a downstream process, and is useful in the field where electronic components and the like are mounted on a substrate to produce a mount substrate.

DESCRIPTION OF REFERENCE NUMERALS AND SIGNS

1 Electronic component mounting system
3 Substrate conveying mechanism
4 Substrate
17 Camera
18 Sorting conveyer
19A, 19B Substrate conveying mechanisms
30 LAN line
M1 Printing device
M2 Print inspection device
M3 Substrate sorting device
M4 Component installation device

The invention claimed is:

1. An electronic component mounting system that comprises a plurality of connected devices for electronic components mounting, and mounts an electronic component on a substrate by solder connection to produce a mount substrate, the electronic component mounting system comprising:
   a printing device that prints solder on an electrode that is formed on the substrate;
   a print inspection device that inspects a printed state of the solder that is printed on the substrate;
   a memory unit that stores an inspection result of the printed state as individual inspection result data that is associated with substrate identification information with which each substrate is identified;
   a component installation device comprising a component installation mechanism that picks up the electronic component from a component supply unit to install the electronic component on the substrate on which the solder is printed based on the inspection result data;
   a substrate standby unit that is provided on a transfer pathway where the substrate is transferred from the print inspection device to the component installation device, and is capable of keeping only one substrate on standby;
   a substrate conveying unit that receives an unloadable signal for indicating that substrate unloading from the print inspection device is possible and a loadable signal for indicating that substrate loading into the component installation device is possible to carry out conveyance of the substrate after printed from the print inspection device to the component installation device;
   a standby substrate information memory unit that stores the substrate identification information on the substrate that is on standby in the substrate standby unit;
   an identification information update processing unit that updates the substrate identification information that is stored in the standby substrate information memory unit accompanying the transfer of the substrate from the print inspection device to the substrate standby unit; and
   information transmission means for transmitting the substrate identification information stored in the standby substrate information memory unit and the inspection result data associated with this substrate identification information to the component installation device.

2. The electronic component mounting system according to claim 1, wherein any one of the print inspection device and the component installation device comprises a plurality of substrate conveying mechanisms, and the substrate standby unit is provided to a substrate sorting mechanism that sorts the substrate into the substrate conveying mechanisms.

3. The electronic component mounting system according to claim 1, wherein the print inspection device that stores inspection result data that comprises a good or bad judgment result of the printed state of the solder and a detection result of a positional deviation amount of a printed position of the solder, and
   the component installation device that corrects a component installation position of the electronic component by controlling the components installation mechanism based on the detection result of the positional deviation amount.

4. The electronic component mounting system according to claim 2, wherein the print inspection device that stores inspection result data that comprises a good or bad judgment result of the printed state of the solder and a detection result of a positional deviation amount of a printed position of the solder, and
   the component installation device that corrects a component installation position of the electronic component by controlling the components installation mechanism based on the detection result of the positional deviation amount.

* * * * *